(12) United States Patent
Ge

(10) Patent No.: US 11,114,158 B1
(45) Date of Patent: *Sep. 7, 2021

(54) REDUCING COLUMN SWITCH RESISTANCE ERRORS IN RRAM-BASED CROSSBAR ARRAY CIRCUITS

(71) Applicant: TETRAMEM INC., Newark, CA (US)

(72) Inventor: Ning Ge, Newark, CA (US)

(73) Assignee: TetraMem Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/264,233

(22) Filed: Jan. 31, 2019

Related U.S. Application Data

(63) Continuation-in-part of application No. 16/255,682, filed on Jan. 23, 2019, now abandoned.

(51) Int. Cl.
*G11C 11/00* (2006.01)
*G11C 13/00* (2006.01)

(52) U.S. Cl.
CPC ...... *G11C 13/0026* (2013.01); *G11C 13/0028* (2013.01)

(58) Field of Classification Search
CPC .................. G11C 13/0026; G11C 13/0028
See application file for complete search history.

(56) References Cited

U.S. PATENT DOCUMENTS

| 10,163,983 | B1* | 12/2018 | Lee | H01L 27/2481 |
| 10,380,386 | B1* | 8/2019 | Strachan | H03M 1/001 |
| 2017/0330916 | A1* | 11/2017 | Hong | H01L 27/2481 |
| 2018/0321942 | A1* | 11/2018 | Yu | G11C 5/02 |

OTHER PUBLICATIONS

U.S. Appl. No. 16/255,682, filed Jan. 2019, Ning Ge.*

* cited by examiner

*Primary Examiner* — Pho M Luu
(74) *Attorney, Agent, or Firm* — MagStone Law LLP

(57) ABSTRACT

Systems and methods for reducing column switch resistance error RRAM-based crossbar array circuits are disclosed. An example crossbar array circuit includes: a crossbar array including a row wire, a column wire, and a cross-point device connected between the row wire and the column wire; a column switch having a column switch input and a column switch output, connected to the cross-point device; an Op-amp device having a non-inverting input, an inverting input, and an Op-amp output; a three-terminal switch having a first terminal, a second terminal, and a third terminal. The three-terminal switch is connected to the inverting input and is configured to switch between the column switch input and the column switch output; a load resistor is connected with the column switch output and the Op-amp output.

8 Claims, 5 Drawing Sheets

US 11,114,158 B1

REDUCING COLUMN SWITCH RESISTANCE ERRORS IN RRAM-BASED CROSSBAR ARRAY CIRCUITS

RELATED APPLICATION

This application is a continuation-in-part of U.S. patent application Ser. No. 16/255,682, filed Jan. 23, 2019, entitled "Row Switch Resistance Error Reduction For RRAM Crossbar Array Circuit," which is hereby incorporated by reference in its entirety.

TECHNICAL FIELD

The present disclosure related generally to RRAM-based crossbar array circuits, and more specifically to reducing column switch resistance error in crossbar array circuits.

BACKGROUND

Crossbar array circuit may be used in non-volatile solid-state memories, signal processing systems, control systems, high-speed image processing systems, and neural networks. A crossbar array circuit may include horizontal metal wire rows and vertical metal wire columns (or other electrodes) intersecting with each other, with crossbar devices formed at the intersecting points.

Crossbar device may include a Resistive Random-Access Memory (RRAM, or so-called memristor). RRAM is a two-terminal passive device that is capable of changing resistance upon sufficient electrical stimulations, which have attracted significant attention for high-performance nonvolatile memory applications. The resistance of the RRAM may be electrically switched between two states: a High-Resistance State (HRS) and a Low-Resistance State (LRS). The switching event from FIRS to LRS is called a "Set" or "On" switching process. Conversely, the switching from LRS to FIRS is called a "Reset" or "Off" switching process.

SUMMARY

The technology disclosed is an RRAM-based crossbar array circuit and more specifically to a crossbar array circuit for reducing column switch resistance error of the crossbar array circuit.

In some implementations, an apparatus includes: a crossbar array including a row wire, a column wire, and a cross-point device connected between the row wire and the column wire; a column switch having a column switch input and a column switch output, connected to the cross-point device; an Op-amp device having a non-inverting input, an inverting input, and an Op-amp output; a three-terminal switch having a first terminal, a second terminal, and a third terminal, wherein the three-terminal switch connected to the inverting input, is configured to switch between the column switch input and the column switch output; and a load resistor connected between the column switch output and the Op-amp output.

In some implementations, the apparatus further includes: a row switch connected to the row wire; a Digital-to-Analog Converter (DAC) connected to the row switch; a Trans-Impedance Amplifier (TIA) connected to the column switch device, wherein the TIA includes the Op-amp device, the three-terminal switch, and the load resistor; and an Analog to Digital Converter (ADC) connected to the TIA.

In some implementations, the cross-point device may be one of: a memristor, a memristive device, a Pulse-Code Modulation (PCM) device, a floating gate device, a phase change device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance.

In some implementations, the cross-point device may be 1-Transistor-1-Resistor (1T1R), 1-Selector-1-Resistor (1S1R), or 2-Resistor (2R) structure.

In some implementations, the row switch includes a Complementary Metal-Oxide Semiconductor (CMOS) switch circuit.

In some implementations, a method includes: preparing an input signal to an apparatus, wherein the apparatus includes: a crossbar array including a row wire, a column wire, and a cross-point device connected between the row wire and the column wire; a column switch having a column switch input and a column switch output, connected to the cross-point device; an Op-amp device having a non-inverting input, an inverting input, and an Op-amp output; a three-terminal switch having a first terminal, a second terminal, and a third terminal, wherein the three-terminal switch connected to the inverting input, is configured to switch between the column switch input and the column switch output; and a load resistor connected between the column switch output and the Op-amp output; opening the first terminal and closing the second terminal; calculating Vout1 of the apparatus and saving Vout1; closing the first terminal and opening the second terminal; calculating Vout2 of the apparatus and saving $V_{out2}$; using $V_{error} = -[(V_{wl} - V_{REF})/(R_{cell})]*R_{colsw}$; subtracting $V_{error}$ from $V_{out1}$; and getting $V_{final} = V_{REF} - [(V_{wl} - V_{REF})/R_{cell}]*Rt$.

In some implementations, a non-transitory computer readable storage medium storing one or more programs, the one or more programs comprising instructions, which when executed by a computing system with one or more processors, cause the computing system to execute a method of: preparing an input signal to an apparatus, wherein the apparatus comprises: a crossbar array comprising a row wire, a column wire, and a cross-point device connected between the row wire and the column wire; a column switch having a column switch input and a column switch output, connected to the cross-point device; an Op-amp device having a non-inverting input, an inverting input, and an Op-amp output; a three-terminal switch having a first terminal, a second terminal, and a third terminal, wherein the three-terminal switch connected to the inverting input, is configured to switch between the column switch input and the column switch output; and a load resistor connected between the column switch output and the Op-amp output; opening the first terminal and closing the second terminal; calculating $V_{out1}$ of the apparatus and saving $V_{out1}$; closing the first terminal and opening the second terminal; calculating $V_{out2}$ of the apparatus and saving $V_{out2}$; using $V_{error} = -[(V_{wl} - V_{REF})/(R_{cell})]*R_{colsw}$; subtracting $V_{error}$ from $V_{out1}$; and getting $V_{final} = V_{REF} - [(V_{wl} - V_{REF})/R_{cell}]*Rt$.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Crossbar array circuits with reduced row switch resistance error term are provided. The technologies described in the present disclosure may provide the following technical advantages:

First, the disclosed technologies enable various designs of a column driver circuit in an RRAM-based crossbar array circuit, which improve Multiplication Product Matrix (MPW) computation in various applications, for example, in Artificial Intelligence (AI), in image recognition applications, in neural network applications, or in signal processing applications. These row driver circuits may provide a higher resolution of RRAM in computing.

In some AI computing applications, a RRAM or memristor may have more than two states (HSR and LRS). A RRAM or memristor, for example, may have multiple states, e.g., 64 levels for 8 bits resolution. The technologies described in the present disclosure can also support these multi-state AI computing applications.

Second, in a large-scale RRAM-based crossbar array circuit, the large number of RRAM cells connected on the same row or column requires higher current and thus increases the effective on-resistance of the switch (or the effective voltage drop across the switch). The effective on-resistance of the switch is one of the serious error terms impacting the performance of a RRAM-based crossbar array circuit, especially in resolution and accuracy during every set, reset, or computing operation. Example column driver circuits disclosed in the present disclosure may reduce the computation error due to the effective on-resistance of a switch.

Third, the design described in the present disclosure would not increase the size of a switch; rather it allows reduction of the size of switch with proposed error cancellation scheme. Increasing the size of a switch would increase in the silicon area, resulting in higher manufacturing cost, requiring higher switch power, and increased parasitic R/C.

Fourth, crossbar array circuit may include a TransImpedance Amplifier (TIA), which may be referred to as a TIA, to obtain signal in the voltage domain. Therefore, with the integration of two switches design into the TIA, the error term may be reduced and minimized.

Figure 1:
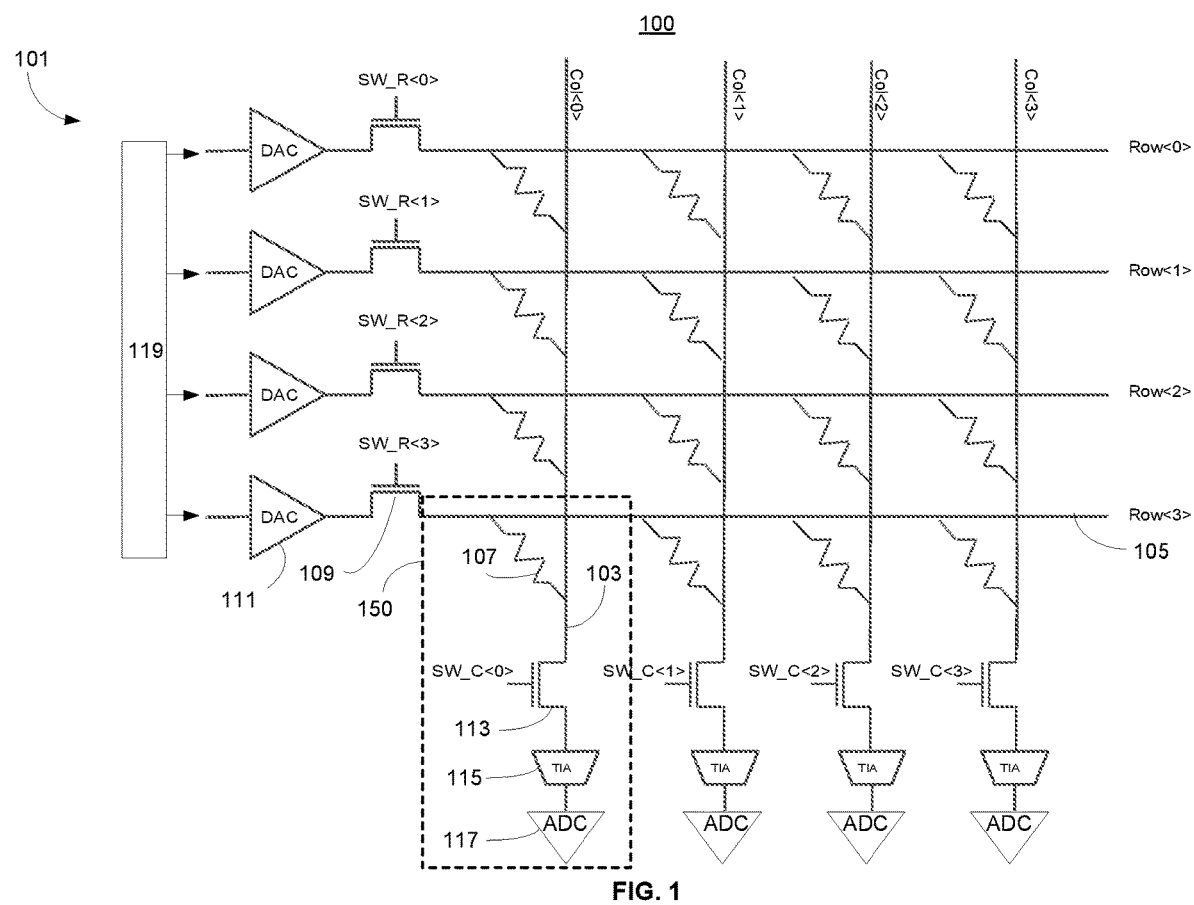
FIG. 1 is a block diagram illustrating an example crossbar array circuit in accordance with some implementations of the present disclosure.

FIG. 1 is a block diagram 100 illustrating an example crossbar circuit 101 in accordance with some implementations of the present disclosure. As shown in FIG. 1, the crossbar array circuit 101 includes a Digital to Analog Converter (DAC) 111; a row switch 109 connected to the DAC 111; a first row wire 105 connected to the row switch 109; a first column wire 103; a cross-point device 107 connected with both the first row wire 105 and the first column wire 103; a column switch 113 connected to the first column wire 103; a TIA 115 connected to the column switch 113; and an Analog to Digital Converter (ADC) 117 connected to the TIA 115.

The DAC 111, in some implementations, converts a digital signal (for example, an input signal 119) into an analog signal. The DAC 111 may include an Operational Amplifier (also referred to as an Op-amp) or may be connected to an Op-amp.

The row switch 109, in some implementations, provides fault protection, ESD protection, and noise reduction. The row switch 109 may include a CMOS switch circuit.

In some implementations, the cross-point device 107 may be one of: a memristor, a memristive device, a Pulse-Code Modulation (PCM) device, a floating gate device, a phase change device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance. The cross-point device 107 may be 1-Transistor-1-Resistor (1T1R), 1-Selector-1-Resistor (1S1R), or 2-Resistor (2R) structure.

In some implementations, the conductance of the cross-point device 107 is tuned by applying a large enough voltage or current signal across the cross-point device 107.

In some implementations, the row wires (e.g., the first row wire 105), the column wires (e.g., the first column wire 103), or both, are metal wires.

The column switch 113, in some implementations, provides fault protection, ESD protection, and noise reduction. The column switch 113 may include a CMOS switch circuit.

In some implementations, the TIA 115 converts a current signal into a voltage signal. The TIA 115 may include a three-terminal switch having two inputs and a single output; the three-terminal switch is configured to switch between the two inputs, which will be explained in more detail with references to at least FIGS. 2-4.

In some implementations, the ADC 117 converts an analog signal into a digital signal. As explained above, when an RRAM-based crossbar circuit is used as the basic cell in MPW in AI core, a higher resolution of RRAM cell is required to provide higher computing performance and maintain lower power consumption. A higher resolution of RRAM cell in computing, however, may require a higher current (with increased current dynamic range). Also, a large number of RRAM cells connected on the same row or column (matrix size) in computing may require a greater conduction current to flow through one or more row switches or column switches. Therefore, an effective on-resistance of the switch (which may also be referred to as a voltage drop across the switch) is one of the serious error terms impacting RRAM resolution in the set, the reset, or the computing operations.

To reduce the effective on-resistance of a switch to be less than ½ LSB of RRAM resolutions, increasing the size of a switch, as a technical solution, may result in several disadvantages.

First, larger silicon area and higher cost are often required. A larger switch size requires a larger silicon area, resulting in higher manufacturing cost.

Second, a higher switching power may be required. A larger switch size requires a higher operating current, which requires a higher switch power.

Third, larger parasitic Resistance/Capacitance (R/C) may be present in the signal path. A larger switch size also leads to a larger parasitic R/C in the signal path, defeating original purpose of increasing a switch size (which is to reduce on-resistance of a switch).

Technologies described in the present disclosure provide a row driver (or a column driver) circuit for RRAM-based crossbar circuit in applications such as AI MPW by reducing or minimizing the effective on-resistance of a switch to meet RRAM resolution/accuracy requirement. These technologies do not increase the size of a switch, reducing adverse effects caused by a larger switch size.

Figure 2:
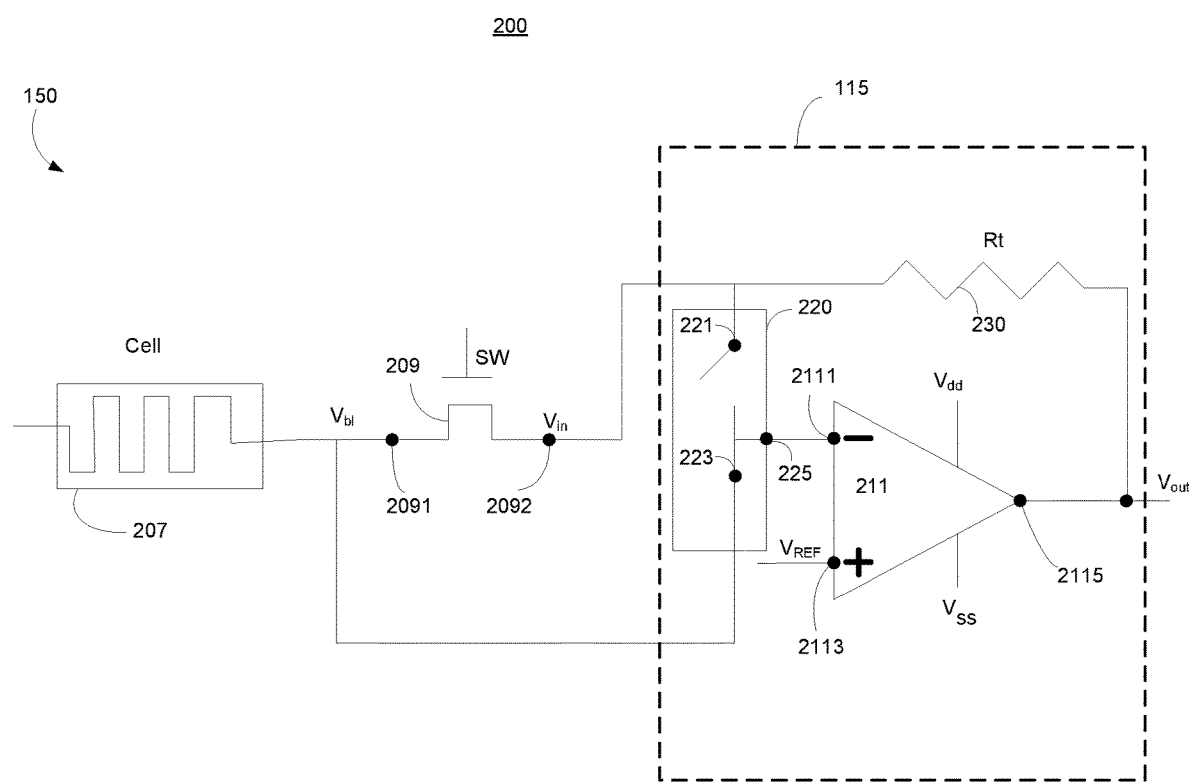
FIG. 2 is a block diagram illustrating a partially enlarged view of an example crossbar array circuit in accordance with some implementations of the present disclosure.

FIG. 2 is a block diagram 200 illustrating a partially enlarged view 150 of the crossbar circuit 101 in accordance with some implementations of the present disclosure. As shown in FIG. 2, the portions of the crossbar circuit 101 shown in the partially enlarged view 150 include an RRAM cell 207; a column switch 209 (which may be connected with a column switch input 2091 and a column switch output 2092) connected to the RRAM cell 207; an op-amp 211 which may be connected with a non-inverting input 2113, an inverting input 2111, and an Op-amp output 2115; a three-terminal switch 220 having a first terminal 221, a second terminal 223, and a third terminal 225; and a load resistor 230 connected between the column switch output 2092 and the Op-amp output 2115. The three-terminal switch 220, which may be connected to the inverting input 2111, is configured to switch between the column switch input 2091 and the column switch output 2092.

The three-terminal switch 220, in some implementations, includes two separate switches (e.g., a first switch 221 and a second switch 223). The first switch 221 may be connected between the column switch input 2091 and the inverting input 2111; the second switch 223 may be connected between the column switch output 2092 and the inverting input 2111, respectively.

In some implementations, the TIA 115 shown in FIG. 1 includes the three-terminal switch 220, the op-amp 211, and the load resistor 230, as shown in FIG. 2. In still some other implementations, the cross-point device 107 shown in FIG. 1 includes the RRAM cell 207 shown in FIG. 2.

Figure 3:
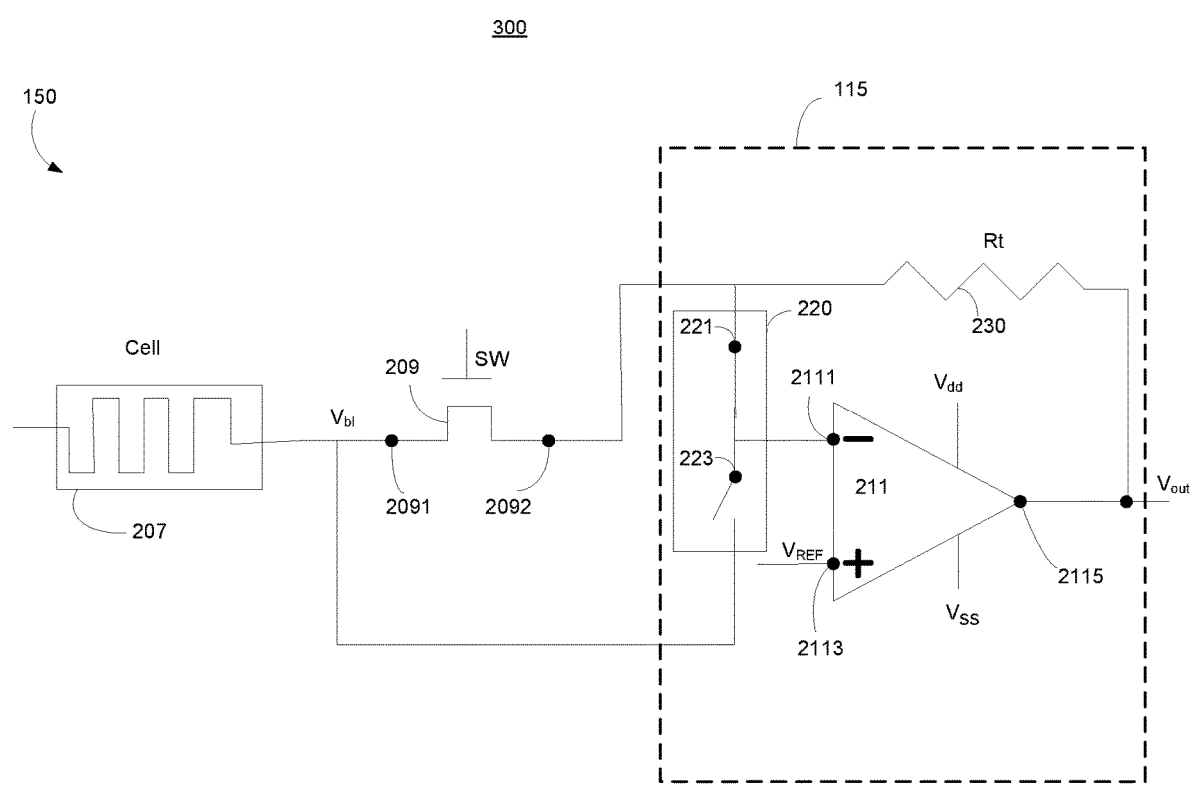
FIG. 3 is a block diagram illustrating the example circuit shown in FIG. 3 with a different switch status.

FIG. 3 is a block diagram 300 illustrating the crossbar circuit 101 in a different switching state. As shown in FIG. 3, the first terminal (or the first switch) 221 is closed, and the second terminal (or the second switch) 223 is open; as shown in FIG. 2, the first terminal (or the first switch) 221 is open, and the second terminal (or the second switch) 223 is closed.

Under ideal operating circumstances, as shown in FIGS. 2 and 3, there would be zero resistance for the column switch 209; as a result, $V_{bl}$ would be equal to $V_{in}$, which would, in turn, be equal to $V_{REF}$ ($V_{bl}=V_{in}=V_{REF}$).

$$V_{out} = V_{REF} - \frac{(V_{wl} - V_{REF})}{R_{cell}} Rt \text{---- (ideal } V_{out})$$

Under real operating circumstances, however, resistance exists in the column switch 209. Especially in a higher current operating environment, such as in a large-scale crossbar circuit, the effect of on-resistance of the switch may be significant.

Under real operating circumstances, $V_{bl}$ may not be equal to $V_{in}$ ($V_{bl} \neq V_{in}$) due to large cell current flow through the column switch 209. And $V_{in}=V_{REF}$ due to the Op-amp feedback control.

$$V_{out} = V_{REF} - \frac{(V_{wl} - V_{REF} - \Delta V_{colsw})}{R_{cell}} Rt,$$

where $V_{error} = -\frac{(\Delta V_{colsw})}{R_{cell}} Rt$, $\Delta V_{colsw} = I_{cell} * R_{colsw}$ As seen, the error term may be significant in impacting the final computation accuracy, depending on (i) the current flow through the column switch 209 and (ii) the switch size. The present disclosure provides technologies for eliminating error term under real operating circumstances. For example, by implementing two additional switches in a TIA (an example of which is shown in FIG. 2), the error term may be reduced.

Figure 4:
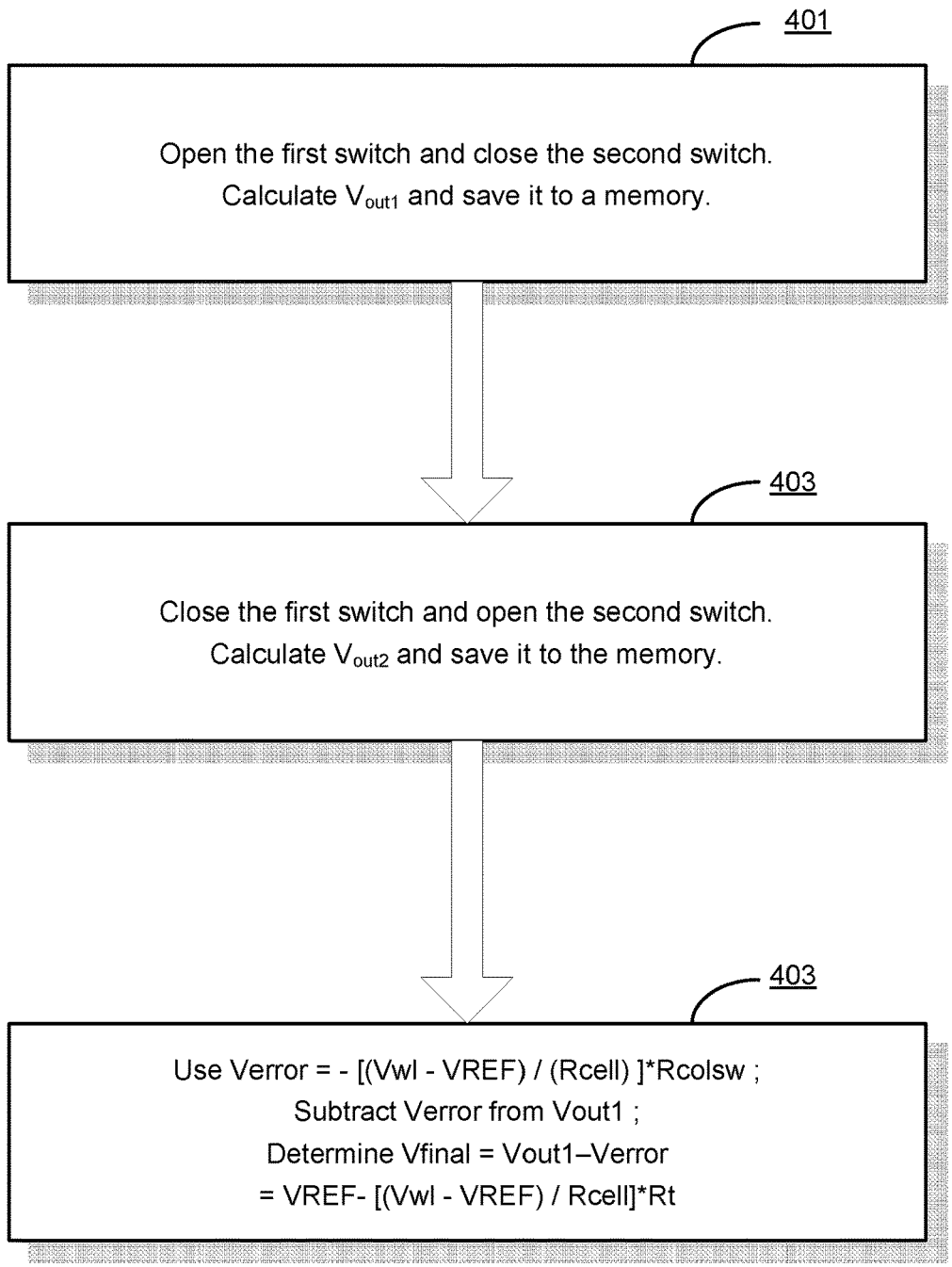
FIG. 4. is a flowchart illustrating an example method for operating an example crossbar array circuit according to some implementations of the present disclosure.

FIG. 4. is a flowchart illustrating an example method 400 for operating an example crossbar array circuit according to some implementations of the present disclosure.

The method 400 for reducing error term by implementing two switches (for example, the first switch 221 and the second switch 223) may include the following steps.

Step 1: Open the first switch 221 (or the first terminal 221) and close the second switch 223 (or the second terminal 223). Vout1 is calculated as follows and stored in a memory:

$$V_{out1} = V_{REF} - \frac{(V_{wl} - V_{REF})}{R_{cell}} (V_{colsw} + Rt).$$

(the step 401 shown in FIG. 4)

Step 2: Close the first switch 221 and open the second switch 223. $V_{out2}$ is calculated as follows and stored in the memory:

$$V_{out2} = V_{REF} - \frac{(V_{wl} - V_{REF})}{R_{cell} + R_{colsw}} Rt.$$

(the step 403 shown in FIG. 4)

Step 3:

$$V_{error} = V_{out2} - V_{out1} = -\frac{(V_{wl} - V_{REF})}{R_{cell} + R_{colsw}} Rt + \frac{(V_{wl} - V_{REF})}{R_{cell}} (V_{colsw} + Rt).$$

Since $R_{colw} \ll R_{cell}$ in design($\sim 1\%$)

$$V_{error} \approx -\frac{(V_{wl} - V_{REF})}{R_{cell}} R_{colsw}.$$

By subtracting $V_{error}$ from $V_{out1}$.

$$V_{final} = V_{out1} - V_{error} = V_{REF} - \frac{(V_{wl} - V_{REF})}{R_{cell}} Rt.$$

(the step 405 shown in FIG. 4)

The outcome from this subtraction is the same as the ideal $V_{out}$ mentioned above.

As seen, therefore, with this example circuit design, the error term caused by the resistance of the column switch in a signal path under a high current may be calibrated and reduced or removed. The technical advantages provided include: increased resolution and accuracy of MPW calculations, as well as the relaxation of the RRAM trimming resolution and accuracy.

Figure 5:
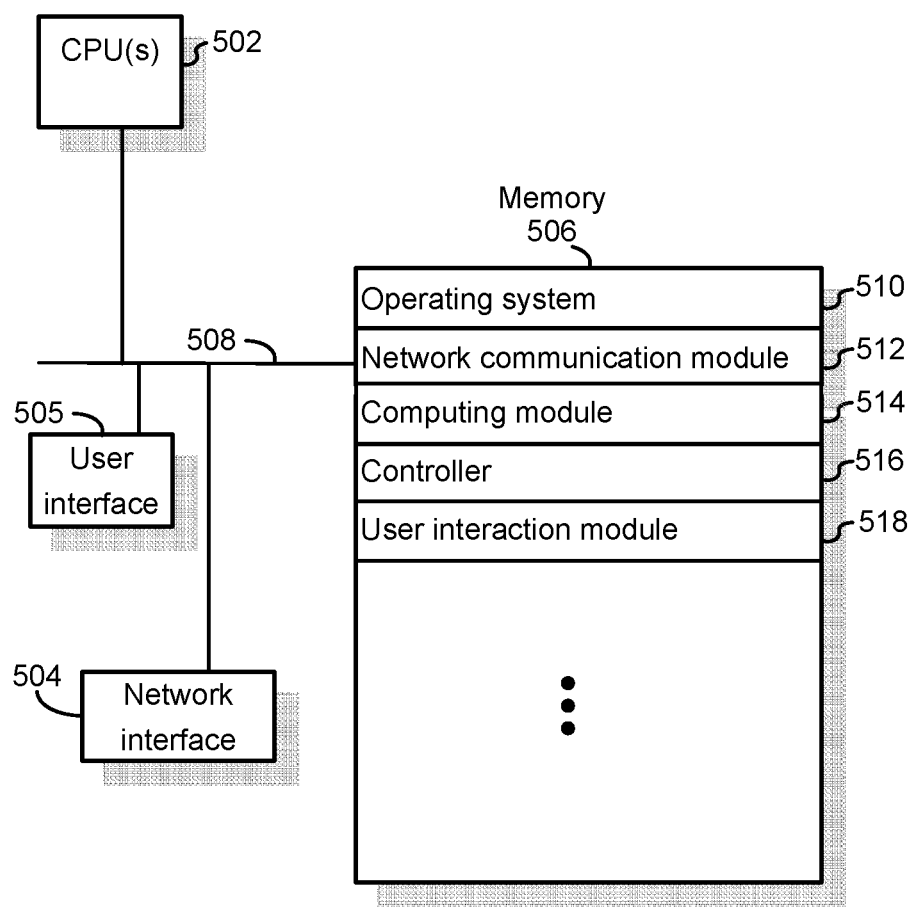
FIG. 5 is a block diagram illustrating an example computing system for implementing a crossbar array circuit with column switch resistance error reduction in accordance with some implementations of the present disclosure.

FIG. 5 is a block diagram illustrating an example computing system 500 for implementing a crossbar array circuit for reducing column switch resistance error in accordance with some implementations.

The computer system 500 may be used to implement at least the crossbar array circuit 101 shown with references to FIG. 1 to FIG. 3. The computer system 500 in some implementations includes one or more processing units CPU(s) 502 (also referred to as processors), one or more network interfaces 504, optionally a user interface 505, a memory 506, and one or more communication buses 508 for interconnecting these components. The communication buses 508 optionally include circuitry (sometimes called a chipset) that interconnects and controls communications between system components. The memory 506 typically includes high-speed random access memory, such as DRAM, SRAM, DDR RAM or other random access solid state memory devices; and optionally includes non-volatile memory, such as one or more magnetic disk storage devices, optical disk storage devices, flash memory devices, or other non-volatile solid state storage devices. The memory 506 optionally includes one or more storage devices remotely located from the CPU(s) 502. The memory 506, or alternatively the non-volatile memory device(s) within the memory 506, includes a non-transitory computer readable storage medium. In some implementations, the memory 506 or alternatively the non-transitory computer readable storage medium stores the following programs, modules, and data structures, or a subset thereof:

- an operating system 510 (e.g., an embedded Linux operating system), which includes procedures for handling various basic system services and for performing hardware dependent tasks;
- a network communication module 512 for connecting the computer system with a manufacturing machine via one or more network interfaces (wired or wireless);
- a computing module 514 for executing programming instructions;
- a controller 516 for controlling a manufacturing machine in accordance with the execution of programming instructions; and
- a user interaction module 518 for enabling a user to interact with the computer system 500, for example, through the user interface 505.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
   a crossbar array comprising a row wire, a column wire, and a cross-point device connected between the row wire and the column wire;
   a column switch having a column switch input and a column switch output, connected to the cross-point device;
   an Op-amp device having a non-inverting input, an inverting input, and an Op-amp output;
   a three-terminal switch having a first terminal, a second terminal, and a third terminal, wherein the three-terminal switch connected to the inverting input is configured to switch between the column switch input and the column switch output; and
   a load resistor connected between the column switch output and the Op-amp output.

2. The apparatus as claimed in claim 1, further comprises:
a row switch connected to the row wire;
a DAC connected to the row switch;
a TIA connected to the column switch device, wherein the TIA comprises the Op-amp device, the three-terminal switch, and the load resistor; and
an ADC connected to the TIA.

3. The apparatus as claimed in claim 1, wherein the cross-point device may be one of: a memristor, a memristive device, a Pulse-Code Modulation (PCM) device, a floating gate, a phase change device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance.

4. The apparatus as claimed in claim 1, wherein the cross-point device may be 1-Transistor-1-Resistor (1T1R), 1-Selector-1-Resistor (1S1R), or 2-Resistor (2R) structure.

5. The apparatus as claimed in claim 1, wherein the column switch comprises a CMOS switch circuit.

6. The apparatus as claimed in claim 1 is configured to function in a multi-state AI computer application.

7. A method comprising:
preparing an input signal to an apparatus, wherein the apparatus comprises:
a crossbar array comprising a row wire, a column wire, and a cross-point device connected between the row wire and the column wire;
a column switch having a column switch input and a column switch output, connected to the cross-point device;
an Op-amp device having a non-inverting input, an inverting input, and an Op-amp output;
a three-terminal switch having a first terminal, a second terminal, and a third terminal, wherein the three-terminal switch connected to the inverting input, is configured to switch between the column switch input and the column switch output; and
a load resistor connected between the column switch output and the Op-amp output;
opening the first terminal and closing the second terminal;
calculating $V_{out1}$ of the apparatus and storing $V_{out1}$ in a memory unit;
closing the first terminal and opening the second terminal;
calculating $V_{out2}$ of the apparatus and storing $V_{out2}$ in the memory unit;
using $V_{error}=-[(V_{wl}-V_{REF})/(R_{cell})]*R_{colsw}$;
subtracting $V_{error}$ from $V_{out1}$; and
obtaining $V_{final}=V_{REF}-[(V_{wl}-V_{REF})/R_{cell}]*R_l$.

8. A non-transitory computer readable storage medium storing one or more programs, the one or more programs comprising instructions, which when executed by a computing system with one or more processors, cause the computing system to execute a method of:
preparing an input signal to an apparatus, wherein the apparatus comprises:
a crossbar array comprising a row wire, a column wire, and a cross-point device connected between the row wire and the column wire;
a column switch having a column switch input and a column switch output, connected to the cross-point device;
an Op-amp device having a non-inverting input, an inverting input, and an Op-amp output;
a three-terminal switch having a first terminal, a second terminal, and a third terminal, wherein the three-terminal switch connected to the inverting input, is configured to switch between the column switch input and the column switch output; and
a load resistor connected between the column switch output and the Op-amp output;
opening the first terminal and closing the second terminal;
calculating $V_{out1}$ of the apparatus and storing $V_{out1}$ in a memory unit;
closing the first terminal and opening the second terminal;
calculating $V_{out2}$ of the apparatus and storing $V_{out2}$ in the memory unit;
using $V_{error}=-[(V_{wl}-V_{REF})/(R_{cell})]*R_{colsw}$;
subtracting $V_{error}$ from $V_{out1}$; and
obtaining $V_{final}=V_{REF}-[(V_{wl}-V_{REF})/R_{cell}]*R_l$.

* * * * *